(12) United States Patent
Kasprak et al.

(10) Patent No.: US 7,961,536 B2
(45) Date of Patent: Jun. 14, 2011

(54) MEMORY DEVICE AND METHODS THEREOF

(75) Inventors: Keith Kasprak, Austin, TX (US); Russell Schreiber, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 68 days.

(21) Appl. No.: 12/422,448

(22) Filed: Apr. 13, 2009

(65) Prior Publication Data
US 2010/0260001 A1    Oct. 14, 2010

(51) Int. Cl.
*G11C 29/00*    (2006.01)
(52) U.S. Cl. .......... 365/201; 365/239; 365/189.04; 365/192; 365/189.02

(58) Field of Classification Search .......... 365/201, 365/239, 189.04, 192, 189.02
See application file for complete search history.

(56) References Cited

U.S. PATENT DOCUMENTS
2007/0168784 A1 * 7/2007 Hazama .......... 714/719
* cited by examiner

*Primary Examiner* — Thong Q Le

(57) ABSTRACT

A device includes a memory configured so that, in the event that one pass-gate transistor associated with a bit cell is determined to be excessively weak such that reading the bit cell could be undesirably difficult, a second pass-gate transistor can be configured to support a read operation. For example, during a manufacturing test procedure, the access speed of each bit cell at a memory device is determined. If a bit cell fails to achieve a desired access speed, the column of the memory that includes the defective bit cell can be configured to access information stored at the bit cell using the second bit line associated with the second pass-gate transistor.

20 Claims, 4 Drawing Sheets

US 7,961,536 B2

MEMORY DEVICE AND METHODS THEREOF

BACKGROUND

1. Field of the Disclosure

The present disclosure relates to data processing devices and more particularly to data processing devices having memory devices.

2. Description of the Related Art

Transistors of a data processing device can exhibit variations in their electrical characteristics resulting from the device manufacturing process. These variations can affect the behavior of the data processing device. If the electrical behavior of a transistor is outside a tolerated range, a portion of the data processing device may fail to meet the stated performance specifications. For example, a bit cell of a memory device can be designed to operate correctly up to a specified six-sigma variation in the threshold voltage of the bit cell pass-gate transistor. If the threshold voltage varies more than this specified amount, electrical current conducted by the pass-gate during a read operation may be insufficient to achieve a specified access speed.

In order to reduce the likelihood of such memory device failure, the memory device can include redundant structures such as extra bit cells. When a portion of the memory device is defective, the memory device can be reconfigured wherein the defective portion is isolated and a redundant structure is substituted for the defective portion. Unfortunately, redundant structures consume considerable physical area and thus increase the cost of the data processing device.

BRIEF DESCRIPTION OF THE DRAWINGS

The present disclosure may be better understood, and its numerous features and advantages made apparent to those skilled in the art by referencing the accompanying drawings.

DETAILED DESCRIPTION

The present disclosure includes a static random access memory (SRAM) where, in the event that one pass-gate transistor associated with a bit cell is determined to be excessively weak, the second pass-gate transistor can be configured to support a read operation. In particular, during a manufacturing test procedure, the access speed of each bit cell at a memory device is determined. If a bit cell fails to achieve a desired access speed, the column of the memory that includes the defective bit cell can be configured to access information stored at the bit cell using the second bit line associated with the second pass-gate transistor. If the desired access speed is achieved, fuse-programming can be used to permanently reconfigure the affected column to use the second bit line. In order to access information from the bit cell using the second bit line, the polarity of information stored at the bit cell must be inverted during a write operation to that bit cell.

Reconfiguration of the bit cell increases the likelihood that the bit cell will perform according to a specification. In particular, the probability of both pass-gate transistors associated with a bit cell both exceed a permissible 6 sigma variation is substantially low. For example, if the threshold voltage of one pass-gate transistor at a bit cell exceeds a six-sigma variation, the probability that the threshold voltage of the second pass-gate transistor at the bit cell also exceeds a six-sigma variation is approximately 8.5 sigma, where sigma represents a standard deviation of observed variation in the threshold voltage of the pass-gate transistor type.

Figure 1:
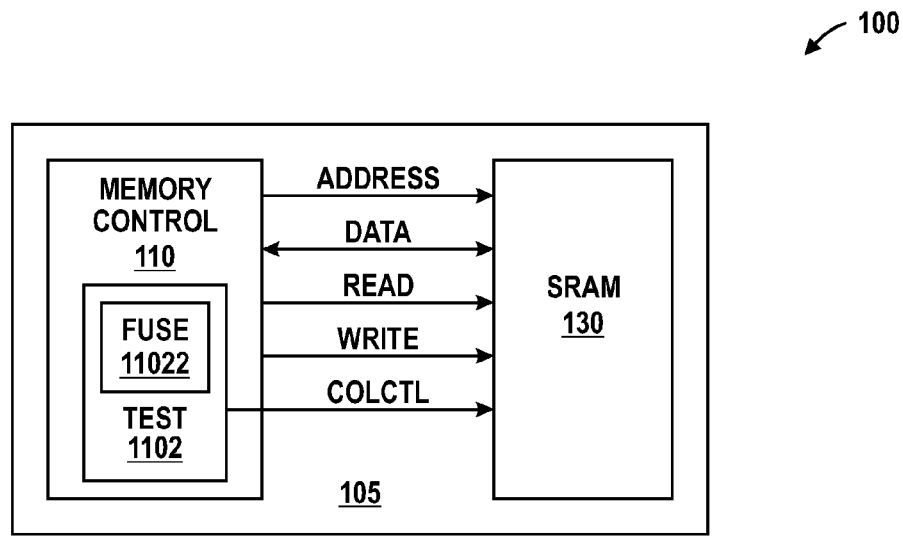
FIG. 1 is a block diagram illustrating a static random access memory (SRAM) of a data processing device in accordance with a specific embodiment of the present disclosure.

FIG. 1 is a block diagram illustrating a device 100 that includes a data processing device 105 in accordance with a specific embodiment of the present disclosure. Data processing device 105 includes a SRAM 130 and a memory control module 110. Memory control module 110 includes a test module 1102. Memory control module 110 is connected to SRAM 130 via nodes labeled "ADDRESS," "DATA," "READ," "WRITE," and "COLCTL." It will be appreciated that for ease of discussion, the term ADDRESS, DATA, READ, WRITE, and COLCTL are used to refer to corresponding nodes, as well as to the signals conducted via a respective node. Memory control module 110 includes test module 1102, and test module 1102 includes fuse module 11022.

SRAM 130 includes an array of bit cells, wherein each bit cell is operable to store one bit of information. The array includes rows and columns, and an individual bit cell can be accessed during a read or a write operation by asserting a corresponding word line and column select signal. For purposes of discussion, a "read operation" refers to an operation whereby information stored at a bit cell is determined and a "write operation" refers to an operation whereby information is stored at the bit cell. Each bit cell is connected to a word line and a pair of bit lines. For a read operation, each bit line of the bit line pair is precharged to a logic-high level prior to the read operation, and assumes a mutually exclusive logic level during the read operation. In particular, the bit line pair is selected by asserting a corresponding column select signal based on column control signal COLCTL. During the read operation, a selected bit cell discharges one bit line of the bit line pair, based on the value of the information stored at the bit cell. During a write operation, each bit line of the bit line pair is driven to an opposite logic level by write circuitry based on the value of the information to be stored at the selected bit cell. The bit lines included at SRAM 130 are referred to as full-swing bit lines because one bit line of the bit line pair is fully discharged, bringing the bit line to approximately ground potential. Read circuitry is configured to access the information stored at the selected bit cell at one bit line of the bit line pair associated with the bit cell.

Memory control module 110 is configured to receive requests from data processing device 105 to store or retrieve information at SRAM 130. Memory control module 110 accesses SRAM 130 using signals ADDRESS, DATA, READ, and WRITE to control a read or write operation in response to the request. Test module 1102 is configured to perform a built-in self test (BIST) procedure to determine whether bit cells at SRAM 130 satisfy desired operating characteristics, such as access speed. During the BIST procedure, test module 1102 writes information at each bit cell and reads information from each bit cell using a selected one of the corresponding bit cell's bit line pair. Based on the write and read operation, the test module 1102 determines if the bit cell is functioning according to a specification. If a bit cell fails to achieve a specified access speed, the column that includes the failing bit cell is reconfigured using signal COLCTL so that information stored at that column is retrieved using the other bit line of the bit line pair, and the test is repeated to determine if the specified access speed is achieved. If the desired access speed is achieved using the second bit line, the bit line selection specified by signal COLCTL can be made permanent by setting a fuse at fuse module 11022 or can be temporarily configured by storing corresponding configuration information at a data register. For example, a fuse at fuse module 11022 can be blown (set to an open circuit condition) to permanently configure signal COLCTL. Thereafter, information is retrieved from bit cells included at the associated column via the bit line indicated by fuse module 11022.

Figure 2:
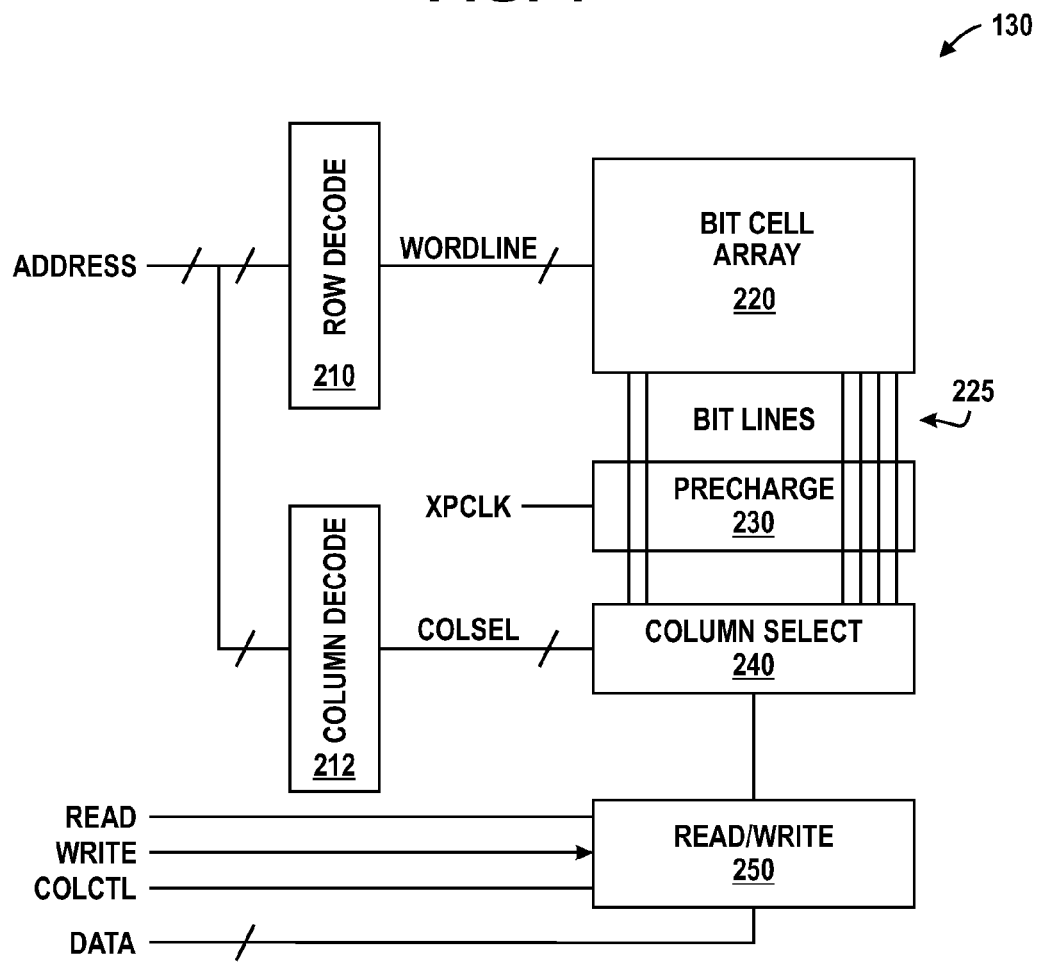
FIG. 2 is a block diagram illustrating the SRAM of FIG. 1 in accordance with a specific embodiment of the present disclosure.

FIG. 2 is a block diagram illustrating the SRAM 130 of FIG. 1 in accordance with a specific embodiment of the present disclosure. SRAM 130 includes a row decode module 210, a column decode module 212, a bit cell array 220, a precharge module 230, a column select module 240, and a read/write module 250. Row decode 210 has an input to receive signal ADDRESS and is connected to bit cell array 220 via a node labeled "WORDLINE." Column decode module 212 has an input to receive signal ADDRESS and an output connected to column select module 240 via a node a labeled "COLSEL". Bit cell array 220 is connected to precharge module 230 and column select module 240 via bit lines 225. Precharge module 230 has an input to receive a precharge clock signal XPCLK. Column select module has an output connected to read/write module 250. Read/write module 250 has an input to receive signal READ, an input to receive signal WRITE, an input to receive signal COLCTL, and an input/output to receive signal DATA during a write operation and to provide signal DATA during a read operation.

Row decode module 210 is configured to decode a portion of binary encoded signal ADDRESS and to provide a plurality of word lines to bit cell array 220. If the storage location specified by signal ADDRESS is associated with a bit cell included at bit cell array 220, a corresponding bit of signal WORDLINE is asserted by row decode module 210. Column decode module 212 is configured to decode another portion of signal ADDRESS and signal COLSEL to column select module 240. If the storage location specified by signal ADDRESS is associated with a bit cell included at bit cell array 220, a corresponding bit of signal COLSEL is asserted, which configures column select module 240 to provide bidirectional communications between bit lines connected to the selected bit cell and read/write module 250.

Precharge module 230 is configured to charge bit lines 225 to a logic-high level before information is retrieved from an associated bit cell during a read operation. Bit lines 225 are precharged in response to the negation of precharge clock signal XPCLK. In an embodiment, precharge clock signal XPCLK is associated with signal COLSEL, such that a bit line is precharged when signal COLSEL is negated, and the precharge is terminated when signal COLSEL is asserted. Both bit lines of a bit line pair are precharged simultaneously prior to a read operation at an associated bit cell.

Read/write module 250 is configured during a write operation to receive information from memory control module 110 via signal DATA and to store the information at the bit cell specified by signal ADDRESS. Read/write module 250 includes a write driver that drives each bit line of a bit line pair to an opposite polarity, the polarity of each bit line determined by the value being stored and by signal COLCTL. During a read operation, read/write module 250 receives information stored at the selected bit cell via one of the bit lines of the bit line pair associated with the bit cell. The information is provided to memory control module 110 via signal DATA. Signal COLCTL determines which bit line of the bit line pair is selected to receive the stored information.

Figure 3:
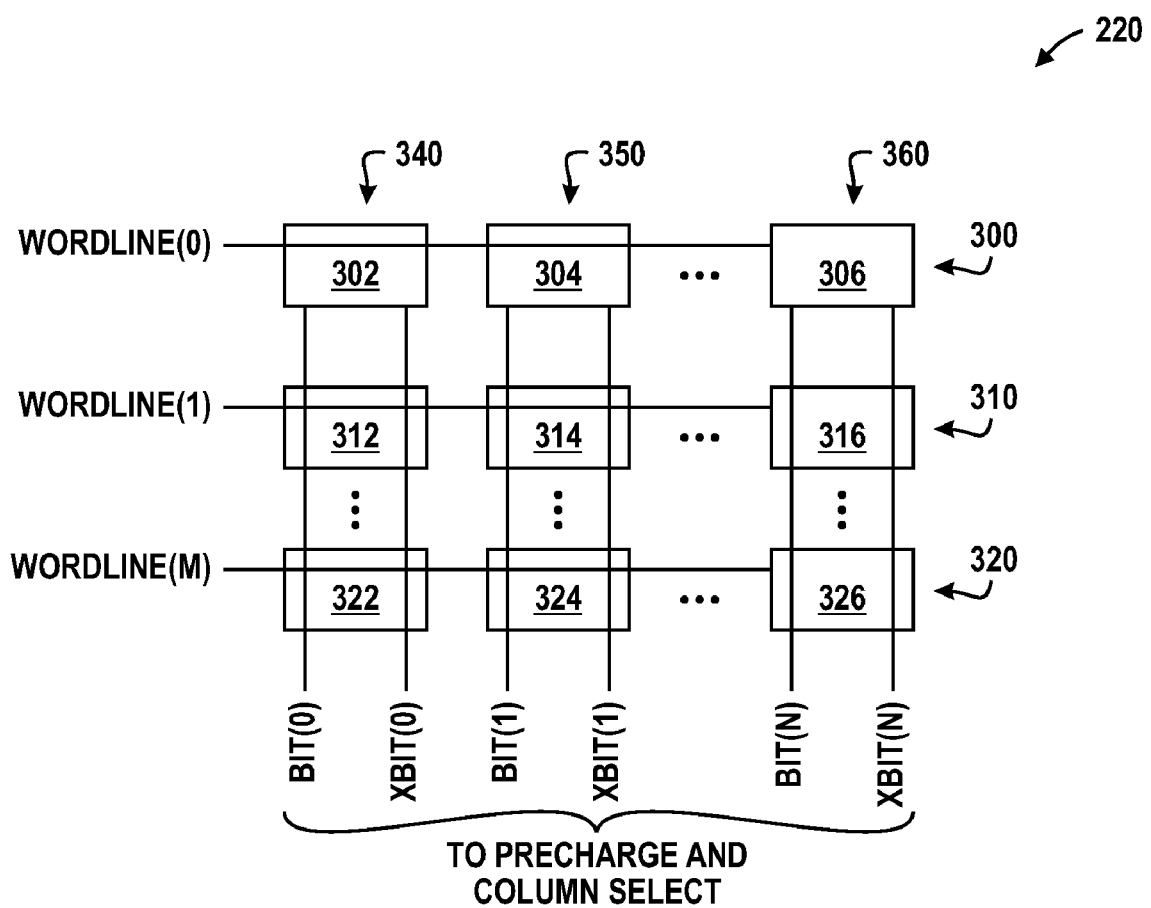
FIG. 3 is a block diagram illustrating a bit cell array of FIG. 2 in accordance with a specific embodiment of the present disclosure.

FIG. 3 is a block diagram illustrating the bit cell array 220 of FIG. 2 in accordance with a specific embodiment of the present disclosure. Bit cell array 220 includes bit cells 302, 304, 306, 312, 314, 316, 322, 324, and 326 organized as an array including rows 300, 310 and 320, and columns 340, 350, and 360. Bit cells 302, 304, and 306 of row 300 are connected to word line signal labeled "WORDLINE(0)." Bit cells 312, 314, and 316 of row 310 are connected to word line signal labeled "WORDLINE(1)." Bit cells 322, 324, and 326 of row 320 are connected to word line signal labeled "WORDLINE(M)." Bit cells 302, 312, and 322 of column 340 are connected to bit line signals labeled "BIT(0)" and "XBIT(0)." Bit cells 304, 314, and 324 of column 350 are connected to bit line signals labeled "BIT(1)" and "XBIT(1)." Bit cells 306, 316, and 326 of column 360 are connected to bit line signals labeled "BIT(N)" and "XBIT(N)." Bit cell array 220 is an array of M rows and N columns. A single bit cell, such as bit cell 302, can be accessed by asserting a corresponding bit of signal WORDLINE and signal COLSEL.

Figure 4:
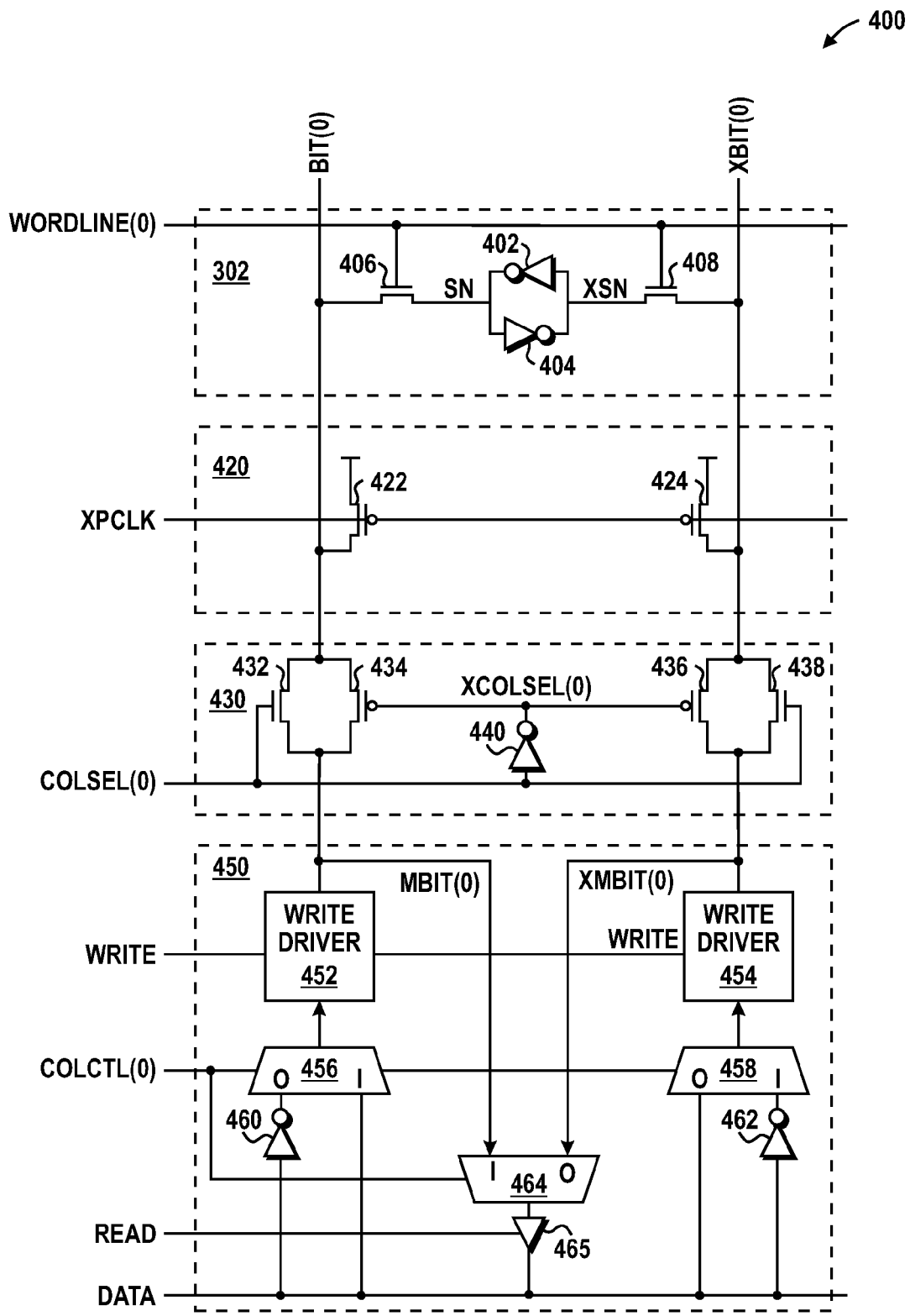
FIG. 4 is a schematic diagram illustrating a column of the SRAM of FIG. 2 in accordance with a specific embodiment of the present disclosure.

FIG. 4 is a schematic diagram illustrating a column 400 of SRAM 130 of FIG. 2 in accordance with a specific embodiment of the present disclosure. Column 400 includes bit cell 302 of FIG. 3, a column precharge module 420 corresponding to a portion of precharge module 230 (FIG. 2), a column select module 430 corresponding to a portion of column select module 240 (FIG. 2), and a column read/write module 450 corresponding to a portion of read/write module 250 (FIG. 2).

Bit cell 302 has a storage module that includes inverter 402 and inverter 404 connected in a latch configuration. Inverter 402 has an input connected to a storage node labeled "XSN," and an output connected to storage node labeled "SN." An n-channel metal oxide semiconductor (NMOS) transistor 406 has a current electrode connected to bit line BIT(0), a control electrode connected to word line WORDLINE(0), and a current electrode connected to storage node SN. NMOS transistor 408 has a current electrode connected to bit line XBIT(0), a control electrode connected to word line WORDLINE(0), and a current electrode connected to storage node XSN. Column 400 can include additional bit cells (not shown), each associated with a corresponding word line.

Column precharge module 420 is configured to precharge bit lines BIT(0) and XBIT(0) to a logic-high level before each read operation at a bit cell included at column 400. Column precharge module 420 includes p-channel MOS (PMOS) transistors 422 and 424. PMOS transistor 422 has a current electrode connected to voltage reference VCC, a control electrode connected to node XPCK, and a current electrode connected to bit line BIT(0). PMOS transistor 424 has a current electrode connected to voltage reference VCC, a control electrode connected to node XPCK, and a current electrode connected to bit line XBIT(0). Bit lines BIT(0) and XBIT(0) are precharged when node XPCK is at a logic-low level.

Column select module 430 is configured to provide bidirectional communication of information between bit lines BIT(0) and XBIT(0) and read/write module 450 when signal COLSEL(0) is asserted. Column select module 430 includes NMOS transistors 432 and 438, PMOS transistors 434 and 436, and inverter 440. Inverter 440 has an input connected to node COLSEL(0) and an output connected to node XCOLSEL(0). NMOS transistor 432 has a current electrode connected to bit line BIT(0), a control electrode connected to node COLSEL(0), and a current electrode connected to a node labeled "MBIT(0)." PMOS transistor 434 has a current electrode connected to bit line BIT(0), a control electrode connected to node XCOLSEL(0), and a current electrode connected to node MBIT(0). PMOS transistor 436 has a current electrode connected to bit line XBIT(0), a control electrode connected to node XCOLSEL(0), and a current electrode connected to a node labeled "XMBIT(0)." NMOS transistor 438 has a current electrode connected to bit line XBIT(0), a control electrode connected to node COLSEL(0), and a current electrode connected to node XMBIT(0).

Read/write module 450 is configured to provide an interface between bit lines MBIT(0) and XMBIT(0) and node DATA. During a read operation, information stored at bit cell 302 is provided to memory control module 110. During a write operation, data received at node DATA is stored at bit cell 302. Read/write module 450 includes write drivers 452 and 454, multiplexors 456, 458, and 464, inverters 460 and 462, and a tri-state driver 465.

Multiplexor 464 and tri-state driver 465 are associated with a read operation at bit cell 302. Multiplexor 464 has a data input connected to node MBIT(0), another data input connected to node XMBIT(0), a control input connected to node COLCTL(0), and an output connected to tri-state driver 465. Tri-state driver 465 has a control input connected to node READ and an output connected to node DATA. When signal COLCTL is asserted, node MBIT(0) is selected and provided at the output of multiplexor 464. When signal COLCTL is negated, node XMBIT(0) is selected and provided at the output of multiplexor 464. During a read operation at SRAM 130, signal READ is asserted and information received at the input of tri-state driver 465 is provided to node DATA. Thus, only one of node MBIT(0) and node XMBIT(0) is used to retrieve information at bit cell 302 during a read operation. When signal READ is negated, tri-state driver 465 is disabled by setting the output of tri-state driver to a high-impedance state.

Write driver 452 and write driver 454 are associated with a write operation at bit cell 302. Write driver 452 has a data input connected to multiplexor 456, a control input connected to node WRITE, and an output connected to node MBIT(0). Write driver 454 has a data input connected to multiplexor 458, a control input connected to node WRITE, and an output connected to node XMBIT(0). When signal WRITE is asserted, information received at the input of write driver 452 is provided to node MBIT(0), and information received at the input of write driver 454 is provided to node XMBIT(0). When signal WRITE is negated, the outputs of write driver 452 and write driver 454 are disabled by setting their outputs to a high-impedance state.

Multiplexor 456 has a data input connected to the output of inverter 460, another data input connected to node DATA, a control input connected to node COLCTL(0). Inverter 460 has an input connected to node DATA. Multiplexor 458 has a data input connected to the output of inverter 462, another data input connected to node DATA, a control input connected to node COLCTL(0). Inverter 462 has an input connected to node DATA. When signal COLCTL(0) is asserted, multiplexor 456 selects information received at node DATA and provides that information at its output. When signal COLCTL(0) is negated, multiplexor 456 selects information received at the output of inverter 460 and provides that information at its output. Thus, when signal COLCTL(0) is asserted, node MBIT is driven to a logic-high level when node DATA is at a logic-high level, and node MBIT is driven to a logic-low level when node DATA is at a logic-low level. When signal COLCTL(0) is negated, multiplexor 458 selects information received at node DATA and provides that information at its output. When signal COLCTL(0) is asserted, multiplexor 458 selects information received at the output of inverter 462 and provides that information at its output. Thus, when signal COLCTL(0) is asserted, node XMBIT is driven to a logic-high level when node DATA is at a logic-low level, and node MBIT is driven to a logic-low level when node DATA is at a logic-high level.

Figure 5:
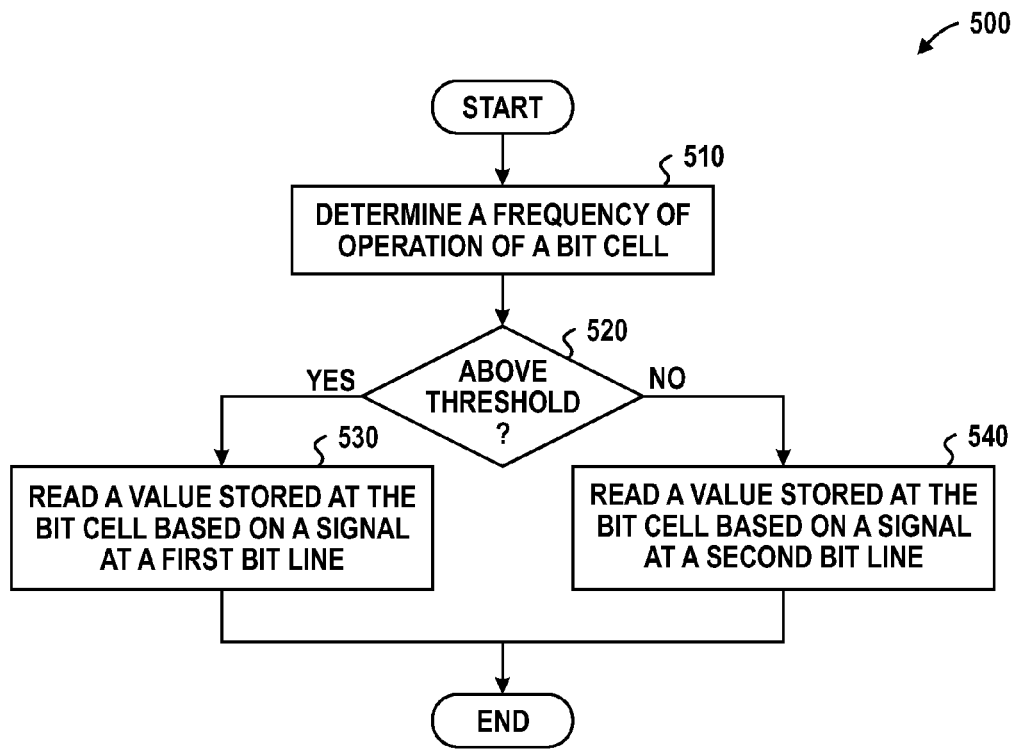
FIG. 5 is a flow diagram illustrating a method in accordance with a specific embodiment of the present disclosure.

FIG. 5 is a flow diagram illustrating a method 500 in accordance with a specific embodiment of the present disclosure. Method 500 begins at block 510 where a frequency of operation of a bit cell is determined. During a manufacturing test procedure, the operating speed of each bit cell is evaluated to determine if the access speed of the bit cell exceeds a minimum threshold. If the operating frequency of the bit cell is above the threshold, the flow proceeds from decision block 520 to block 530, where a value stored at the bit cell is read based on a signal at a first bit line of a bit line pair. If the operating frequency of the bit cell is not above the threshold, the flow proceeds from decision block 520 to block 540, where a value stored at the bit cell is read based on a signal at the other bit line of the bit line pair. A column configuration control signal, such as COLCTL(0), specifies which bit line of the bit line pair is selected to complete the read access, based on the results of the manufacturing test procedure. It will be appreciated that the column configuration signal is shared by all bit cells included at the corresponding column.

When information stored at a bit cell is retrieved using the second bit line of a bit line pair, the information appears to be inverted compared to if the bit cell is accessed using the first bit line of a bit line pair. Therefore, the polarity of the value stored at that bit cell must be inverted during a write operation at that bit cell. Signal COLCTL configures both the write and the read circuitry at read/write module 250 to provide the necessary inversion during a write operation when a column is configured to use the second bit line to perform a read operation.

Figure 6:
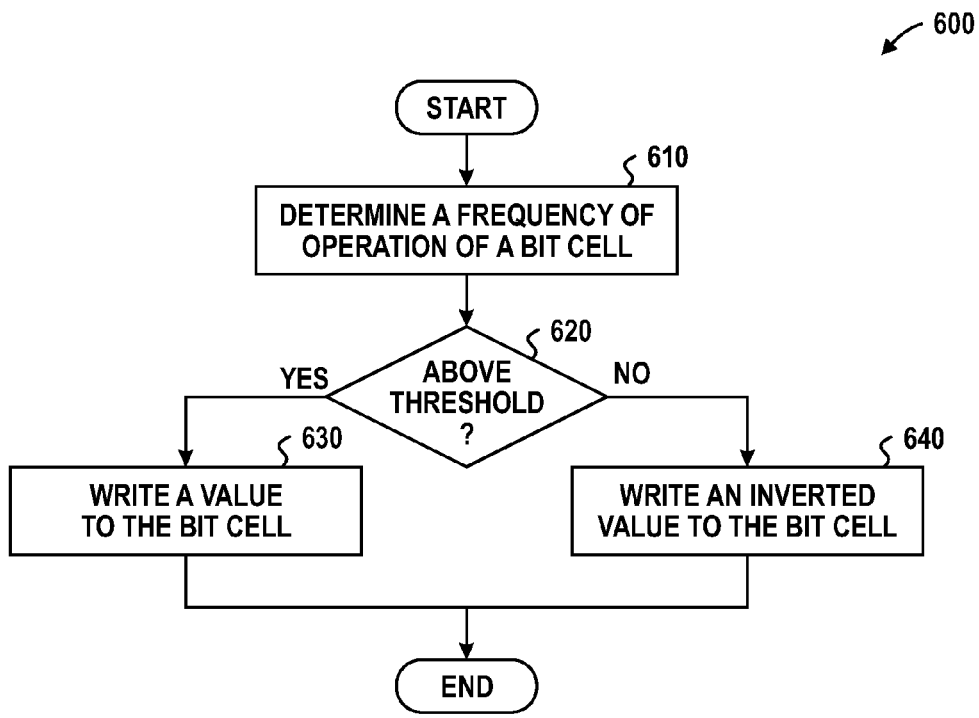
FIG. 6 is a flow diagram illustrating a method in accordance with a specific embodiment of the present disclosure.

FIG. 6 is a flow diagram illustrating a method 600 in accordance with a specific embodiment of the present disclosure. Method 600 begins at block 610 where a frequency of operation of a bit cell is determined. During a manufacturing test procedure, the operating speed of each bit cell is evaluated to determine if the access speed of the bit cell exceeds a minimum threshold. If the operating frequency of the bit cell is above the threshold, the flow proceeds from decision block 620 to block 630, where a value is written to the bit cell by applying a signal indicative of the value to a first bit line of the bit line pair, and the inverse of the value is applied to the second bit line of the bit line pair. If the operating frequency of the bit cell is not above the threshold, the flow proceeds from decision block 620 to block 640, where a value is written to the bit cell by applying a signal indicative of the value to a second bit line of the bit line pair, and the inverse of the value is applied to the first bit line of the bit line pair.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

For example, the access speed of each bit cell can be determined during a manufacturing test procedure using BIST circuitry included with the device. In another embodiment, the test procedure can be conducted by automated test equipment (ATE) via external interface pins of the device. Furthermore, testing of SRAM 130 can be conducted via a Joint Test Action Group (JTAG) interface. Based on the results of the test procedure, fuse-programming can be used to permanently configure each column of the device as described herein. In another embodiment, a test procedure can be executed by the basic input/output system (BIOS) each time data processing device 105 is initialized, and a data register can be used to store column configuration information.

The present disclosure can be implemented in combination with known memory redundancy techniques. For example, a memory device can include extra rows, columns, or banks, and the memory device can be configured to substitute failing portions of the memory device with the redundant structures. The devices and methods described herein can be used to improve product yield in the presence of marginal failures resulting from excessive electrical variations, while redundant structures techniques can be reserved for hard failures, such as fully defective transistors.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
   determining a frequency of operation of a first bit cell;
   in response to determining the frequency of operation of the first bit cell is above a first threshold, reading a value stored at the first bit cell based on a first signal at a first bitline; and
   in response to determining the frequency of operation of the first bit cell is not above the first threshold, reading a value stored at the first bit cell based on a second signal at a second bitline.

2. The method of claim 1, further comprising:
   in response to determining the frequency of operation of the first bit cell is above the first threshold, writing the value to the first bit cell by applying a third signal to the first bitline and a fourth signal to the second bitline; and
   in response to determining the frequency of operation of the first bit cell is not above the first threshold, writing the value to the first bit cell by applying the third signal to the second bitline and the fourth signal to the second bitline.

3. The method of claim 2, wherein the fourth signal is an inverted representation of the third signal.

4. The method of claim 1, wherein determining the frequency of operation of the first bit cell comprises:
   applying a built-in-self test (BIST) pattern to the first bit cell apply a test pattern to the first bit cell; and
   determining the frequency of operation in response to applying the BIST pattern.

5. The method of claim 4, wherein applying the BIST pattern comprises applying the BIST pattern in response to a power-on reset (POR) event at a data processing device comprising the first bit cell.

6. The method of claim 1, wherein determining the frequency of operation of the first bit cell comprises determining the frequency of operation based on a first status indicator at a data processing device.

7. The method of claim 1, wherein the first status indicator comprises a fuse.

8. The method of claim 1, further comprising:
   determining a frequency of operation of a second bit cell;
   in response to determining the frequency of operation of the second bit cell is above a second threshold, reading a value stored at the second bit cell based on a third signal at a first bitline; and
   in response to determining the frequency of operation of the second bit cell is not above the second threshold, reading a value stored at the second bit cell based on a second signal at the second bitline.

9. A method, comprising:
   determining a frequency of operation at a first bit cell;
   in response to determining the frequency of operation at the first bit cell is above a first threshold, writing a first value to the first bit cell by applying a first signal to a first bitline of the first bit cell and applying a second signal to a second bitline of the first bit cell; and
   in response to determining the frequency of operation at the first bit cell is not above the first threshold, writing the first value to the first bit cell by applying the first signal to the second bitline and applying the second signal to the first bitline.

10. The method of claim 9, further comprising:
    in response to determining the frequency of operation at the first bit cell is above the first threshold, reading the first value from the first bit cell based on a signal at the first bitline; and
    in response to determining the frequency of operation at the first bit cell is not above the first threshold, reading the first value from the first bit cell based on a signal at the second bitline.

11. The method of claim 9, further comprising:
    determining a frequency of operation at a second bit cell;
    in response to determining the frequency of operation at the second bit cell is above a second threshold, writing a second value to the second bit cell by applying a third signal to a third bitline of the second bit cell and applying a fourth signal to a fourth bitline of the second bit cell; and
    in response to determining the frequency of operation at the second bit cell is not above the second threshold, writing the second value to the second bit cell by applying the third signal to the fourth bitline and applying the fourth signal to the third bitline.

12. The method of claim 9, wherein determining the frequency of operation of the first bit cell comprises determining a state of a first indicator at a data processing device comprising the first bit cell.

13. The method of claim 12, wherein the first indicator comprises a fuse.

14. The method of claim 12, wherein the first indicator comprises a programmable storage element.

15. The method of claim 9, wherein determining the frequency of operation comprises determining the frequency of operation in response to application of a test pattern to the first bit cell.

16. A device, comprising:

a first bitcell comprising a first terminal coupled to a first bitline and a second terminal coupled to a second bitline; and a first multiplexer comprising a first input coupled to the first bitline, a second input coupled to the second bitline, a control input to receive a first control signal indicative of a frequency of operation of the first bitcell, and an output.

17. The device of claim 16, further comprising a second multiplexer comprising a first input to receive a first write signal, a second input to receive a second write signal, a control input to receive the first control signal, and an output coupled to the first bitline.

18. The device of claim 17, further comprising a third multiplexer comprising a first input to receive the first write signal, a second input to receive the second write signal, a control input to receive the first control signal, and an output coupled to the second bitline.

19. The device of claim 18, wherein in response to the control signal being in a first state, the second multiplexer couples the first input of the second multiplexer to the first bitline and the third multiplexer couples the second input of the third multiplexer to the second bitline.

20. The device of claim 16, further comprising:

a second bitcell comprising a first terminal coupled to a third bitline and a second terminal coupled to a fourth bitline; and a second multiplexer comprising a first input coupled to the third bitline, a second input coupled to the fourth bitline, a control input to receive a second control signal indicative of a frequency of operation of the second bitcell, and an output.

* * * * *